United States Patent [19]

Peroni

[11] Patent Number: 4,741,582
[45] Date of Patent: May 3, 1988

[54] MOUNTING FASTENER

[75] Inventor: Peter A. Peroni, Pottstown, Pa.

[73] Assignee: Lafrance Corporation, Philadelphia, Pa.

[21] Appl. No.: 429,466

[22] Filed: Sep. 30, 1982

[51] Int. Cl.[4] .............................................. B25G 3/00
[52] U.S. Cl. .............................. 312/257 SK; 403/85; 403/95; 403/406.1; 403/407.1
[58] Field of Search .................. 403/406, 407; 411/84, 411/85, 87, 91, 92, 95, 104; 312/140, 257 SK

[56] References Cited

U.S. PATENT DOCUMENTS

| 329,063 | 10/1885 | Mintle | 411/96 |
|---|---|---|---|
| 558,799 | 4/1896 | Gibbons | 411/95 |
| 2,345,650 | 4/1944 | Attwood | 411/105 |
| 2,643,081 | 6/1953 | Spring | 108/56.1 |
| 2,783,960 | 3/1957 | Herz et al. | 108/56.1 |
| 2,922,606 | 1/1960 | Glassman et al. | 108/56.1 |
| 3,034,844 | 5/1962 | Anderson et al. | 312/257 SK |
| 3,504,723 | 4/1970 | Cushman et al. | 411/82 |
| 3,884,006 | 5/1975 | Dietlein | 411/82 |
| 4,315,393 | 2/1982 | Schack et al. | 411/908 |
| 4,393,999 | 7/1983 | Forshee | 108/901 |

OTHER PUBLICATIONS

TES Brochure, Hans Tappert, P. O. B. 5011, Otto-Hahn=Strasse 9, D 4018 Langenfeld, Germany.
Interlok Model 34 Brochure, Interlok, 770 Airport Boulevard, Burlingame, California 94010.
Optima Accent Cases Brochure, Scientific-Atlanta, Inc., 2166 Mountain Industrial Boulevard, Tucker Georgia 30084 (Jul. 1977).
Buckeye Keyboard/Terminal Enclosures Brochure, the Buckeye Stamping Company, 555 Marion Road, Columbus, Ohio 43207.
Intra Fab's Totally Integrated Cabinet System Brochure, Intra Fab, Inc. 660 Lenfest Road, San Jose California 95133 (Mar., 1980).
Eurosystem-C- Brochure, Elräck GmbH, Postfach 1160, D-4044 Kaarst 1, Germany.
Desk Top Consoles Brochure, Hammond Manufacturing, 1690 Walden Avenue, Buffalo, New York 14255 (Sep. 1978).
Buckeye Brochure, the Buckeye Stamping Company, 555 Marion Road, Columbus, Ohio 43207.
CS 2001 paper.

*Primary Examiner*—Joseph Falk
*Attorney, Agent, or Firm*—Connolly & Hutz

[57] ABSTRACT

A mounting fastener includes a nut carrier having a pair of oppositely extending resilient wings which extend below the nut carrier and spread as the carrier is slid in a confined track to hold the carrier in position until a bolt or other fastener is threaded into the nut.

10 Claims, 2 Drawing Sheets

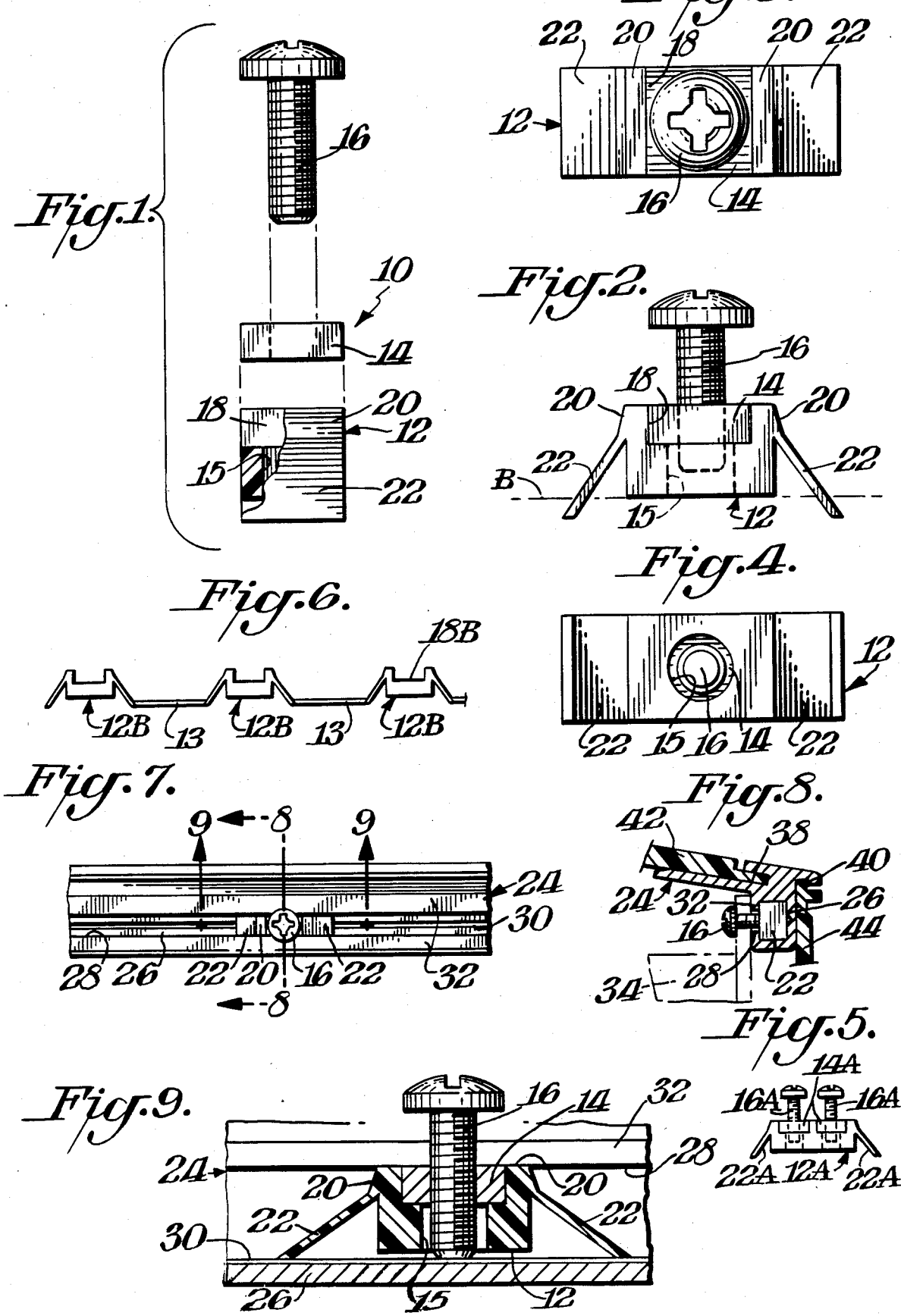

4,741,582

MOUNTING FASTENER

BACKGROUND OF THE INVENTION

Fasteners have long been known in the art for mounting various objects in place. One particular utility for the type of fasteners with which the invention is concerned relates to electronic instrument housings. Such housings frequently include rails or other tracks to which various objects such as card carriers are mounted. It is desirable that the fasteners be slidably mounted so as to permit a precise positioning of these various objects at any desired location.

SUMMARY OF THE INVENTION

An object of this invention is to provide a mounting fastener which is convenient to manipulate and effective in mounting an object at any desired location.

A further object of this invention is to provide such a fastener which has particular utility with instrument housings by sliding in the rails or tracks therein.

In accordance with this invention, the mounting fastener comprises a nut carrier which includes a pair of downwardly extending wings with the wings extending below the carrier itself. The carrier would be slid into a tightly fitting track whereupon the wings would spread to firmly hold the carrier in place until a fastener is tightened into the nut.

In a preferred practice of this invention, the nut carrier is made of a suitable plastic material which includes a pocket for receiving the nut. The nut itself may be of any conventional construction such as a square steel nut.

THE DRAWINGS

FIG. 1 is an exploded view of a mounting fastener in accordance with this invention;

FIG. 2 is a side view in elevation showing the fastener of FIG. 1 with the various components assembled;

FIGS. 3 and 4 are top and bottom plan views, respectively; of the fastener shown in FIG. 2;

FIG. 5 is a side elevation view of a modified form of fastener;

FIG. 6 is a side elevation view of yet another form of fastener;

FIG. 7 is a front elevation view showing a fastener incorporated in an instrument housing;

Figure 10:
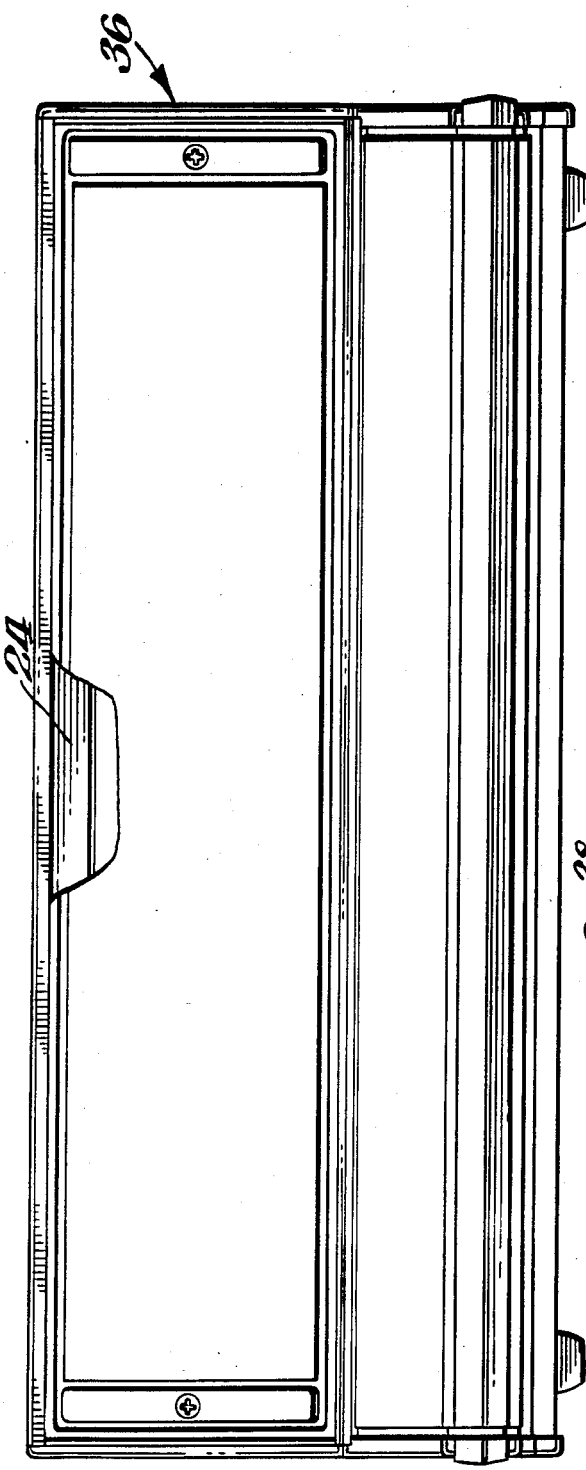
Figure 11:
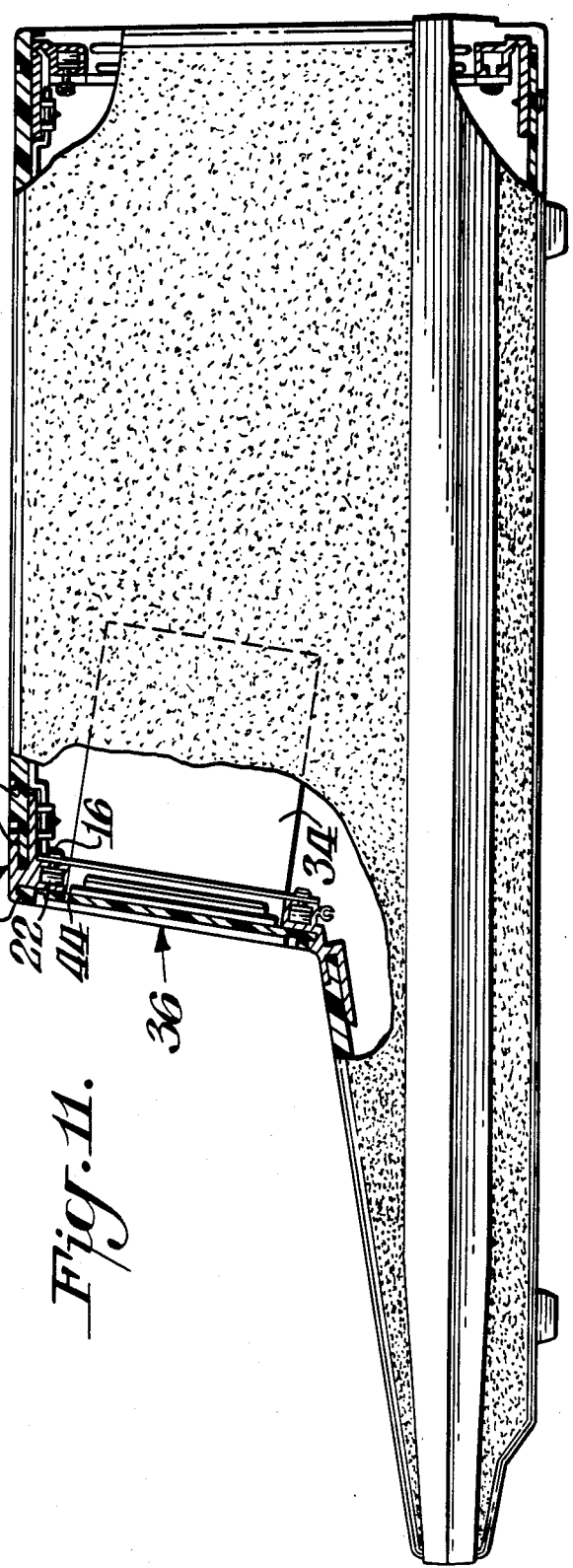

FIGS. 8 and 9 are cross sectional views in elevation taken through FIG. 7 along the lines 8—8 and 9—9, respectively;

FIG. 10 is a front view in elevation partly broken away of an instrument housing in accordance with this invention;

FIG. 11 is a side view partly in section of the instrument housing shown in FIG. 10.

DETAILED DESCRIPTION

FIG. 1 shows the various components of the fastener 10. As indicated therein, the components include a nut carrier 12 which receives a nut 14. Additionally a fastening element 16 such as a bolt or screw is provided for threadably engaging nut 14.

As shown in FIG. 2, nut carrier 12 is provided in its upper surface with a pocket or seat 18 formed by a pair of shoulders 20 dimensioned to snugly receive nut 14. Resilient wings 22 integrally extend outwardly from shoulders 20 to a point beyond the lower edge of carrier 12 as indicated by the line B.

The provision of the nut carrier has particular utility in cooperation with a track or channel 24 such as illustrated in FIGS. 7-9. In this respect, the nut carrier serves to initially position the nut at any desired location until the fastening element 16 is manipulated to firmly engage the nut in place.

As shown in FIGS. 7—9, the track or channel 24 is formed as an extrusion of generally C shape having a lower wall 26 and an upper wall formed with an opening 28. A V-shaped groove 30 is provided in lower wall 26.

In use, the components of fastener 10 would be assembled by locating nut 14 in the pocket 18 of carrier 12. Carrier 12 would then be inserted into track 24 with the exposed threaded opening of nut 14 located juxtaposed the opening or slot 28 of track 24. To facilitate sliding movement of the components within track 24, fastening element 16 may also threadably engage nut 14 prior to insertion of fastener 10. The user may then grasp fastening element 16 and use fastening element 16 as a handle to slide fastener 10 to the desired position. Alternatively, any suitably dimensioned implement such as a pencil, screwdriver or the like may be inserted into nut 14 and manipulated as a handle.

Fastener 10 is dimensioned so that its carrier or body portion 12 is only slightly smaller than the interior of track 24. Because wings 22, however, extend below carrier body 12, a friction or spring type hinge fit results from the wings with respect to the track interior. This is best shown in FIG. 9 where wings 22 are spread outwardly from the rest condition shown in FIG. 2. As shown in FIG. 9, the tips or remote ends of wings 22 are in contact with the lower surface 26 of track 24 while the upper edges of shoulders 20 are in contact with the spaced walls 32 which form the upper edges of the upper wall of track 24. This spring-like action results in fastener 20 remaining in whatever location is desired until or unless it is forcefully moved by sliding it to another position.

The operation described above is advantageous for use, for example, in an instrument housing where a series of fasteners is desired to precisely locate various components. In this respect each fastener would be located individually in its desired location until it is time to mount the components. If fastening element 16 had been used as a handle, the fastening element 16 is then removed and the component 34, shown in phantom in FIG. 8, is located against the outer surface of track 24 with a suitable hole in component 34 aligned with the hole in nut 14. Fastening element 16 is then telescoped through the hole in component 34 and into threaded engagement with nut 14. Fastening element 16 is then rotated until its lower end contacts lower wall 26 at groove 30. The interaction of the rotating fastening element 16 threadably engaged with nut 14 results in drawing nut 14 up against walls 32 of track 24 to firmly mount the component 34 in place. Thereafter carrier 12, in effect, simply floats having served its purpose of initially positioning the nut.

As is apparent from the drawings, axial hole 15 in carrier 12 is oversize with respect to the nut hole so as to provide clearance for the fastening element 16.

FIG. 5 shows a variation of this invention wherein carrier 12A includes a pair of pockets for receiving a pair of nuts 14A which may be desired in specialized cases where the component has a pair of openings a fixed distance apart equal to the distance between fasteners 16A or where it is desired to mount two separate components a fixed distance apart.

The concepts of this invention may be practiced with a nut carrier having any suitable number of pockets. Similarly, FIG. 6 shows an arrangement wherein the fastener includes three carriers 12B, each of which has a pocket 18B. The carriers are interconnected by bridge members or webs 13.

The embodiment of FIG. 6 provides the option of having a plurality of carriers used as a unit or permitting the mass production of individual or multiple carriers by later removing or severing the connecting webs.

Fastening element 16 and nut 14 would be of conventional construction such as made from suitable metal such as steel. Carrier 12, however, and its integral wings 24 are preferably made of a plastic material such as polypropylene having memory characteristics so that the wings function as springs for hinges.

The nut carrier 12 is shown as a separate member from nut 14, and wings 22 are shown as integral with the nut carrier 12. The concepts of this invention, however, may also be practiced by having the nut carrier and nut integral such as by forming the nut carrier from a material which can be threaded or otherwise interact with a fastening member. Similarly the resilient spring-like wings may be separate members which are mounted to the nut carrier.

FIGS. 10–11 show an instrument housing 36 which includes a plurality of extruded track members for receiving various fasteners. Instrument housing 36 also represents an improvement over the art. In this respect, housing 36 is formed by a framework of metal extrusions which include slots for receiving and tying together plastic plates or side walls. FIGS. 8 and 11, for example, show the extrusions 24 formed with slots 38, 40 for receiving plates 42, 44. The advantage of a housing formed in this manner is that the necessity for very expensive molds is avoided. The use of plastic plates made, for example, from a thermoplastic such as ABS, polycarbonate, norel etc. represents a departure from the prior art which had considered such materials to be of insufficient strength. The combination, however, of the extruded rails from a material such as aluminum and plastic sides could result in dramatically reducing the cost of a housing. The use of the extrusions with detachable plates also permits a wide variety of different size and shape housing to be manufactured such as by including or omitting a keyboard. The housings could be assembled as a production unit or the components could be provided in kit form.

Depending on the intended use of the housing, various components can be mounted therein through the use of fasteners 10. Such components, for example, could include chassis work, p.c. board mounted components and p.c. cards.

By use of the extrusions and plastic side panels and of the nut carriers, the time for assembling a housing could be materially reduced to a matter of minutes. The resulting housing would also be one which is of light weight yet capable of carrying heavy loads.

What is claimed is:

1. A mounting fastener comprising a nut carrier, means on said nut carrier for receiving a nut or the like which is capable of engagement with a fastening element, a wing section extending from opposite sides of said nut carrier outwardly from and below the lower surface of said nut carrier to provide a spring-like engagement with a track into which said nut carrier may slide, said means on said nut carrier including a recess in the upper surface of said nut carrier to form a pocket therein, a free standing threaded nut snugly located in said pocket, said nut carrier being made of a plastic material to facilitate the sliding movement thereof for initially sliding said fastener to the desired location, a threaded fastening element in threaded engagement with said nut, and said nut carrier having a bore coaxial with and of a larger diameter than the threaded opening of said nut whereby said fastening element may penetrate said nut carrier bore without contacting said nut carrier with said nut carrier thereby functioning as a follower when said nut and said fastening element are threaded into a locked position.

2. The fastener of claim 1 wherein a plurality of said pockets are formed in said nut carrier.

3. The fastener of claim 1 wherein a plurality of said nut carriers are provided, and a connecting member connecting pairs of said nut carriers together.

4. The fastener of claim 1 in combination therewith, a track, said track having a bottom wall and a slotted upper wall, said nut carrier being slidably mounted in the interior of said track, and said nut being juxtaposed to the slot of said slotted upper wall.

5. The combination of claim 4 including said fastening element extending through said slot in engagement with said nut whereby a component may be mounted from said fastening element.

6. The combination of claim 5 including a plurality of said nut carriers in said track.

7. The fastener of claim 1 in combiantion therewith, a track, said carrier being inserted in said track, said track being a metal extrusion member having at least one exposed groove therein, a plurality of said extrusion members being connected together to form the framework of said housing, and the sides of said housing being plastic panels inserted in said grooves.

8. In an instrument housing having a plurality of sides mounted to a framework, the improvement being at least a portion of said framework being in the form of extruded track members, each track member being of U-shaped cross-section with the free ends of the U bent toward each other to create an elongated slot remote from the bight of the U, a plurality of mounting fasteners slideably mounted in said track members, each of said mounting fasteners comprising a nut carrier captured in said track member, said nut carrier including a recess in its outer surface with said recess being exposed through said slot, said recess thereby forming an exposed pocket, a free standing nut snugly located in said pocket, a wing section extending from opposite sides of said nut carrier outwardly from and below the inner surface of said nut carrier to provide spring-like engagement with said track member with said wing sections being in contact with said bight and urging said outer surface against said bent free ends of said U whereby said nut carrier may slide to a predetermined location and may be temporarily maintained at that location, and a threaded fastener exending through said slot and being in threaded engagement with said nut whereby said fastener is capable of functioning as a handle for sliding said nut carrier and whereby a component for said housing may be mounted in place by being mounted to said fastener.

9. The housing of claim 8 wherein said wing sections and said nut carrier are made of a plastic material.

10. The housing of claim 8, each of said track members being a metal extrusion member having at least one exposed groove therein, a plurality of said extrusion members being connected together to form said framework of a housing, and the sides of said housing being plastic panels inserted in said groove members.

* * * * *